(12) United States Patent
Ho et al.

(10) Patent No.: US 11,810,643 B2
(45) Date of Patent: Nov. 7, 2023

(54) WORD LINE DRIVING CIRCUIT WITH HIGH ACCESS EFFICIENCY

(71) Applicant: UNITED MICROELECTRONICS CORP., Hsin-Chu (TW)

(72) Inventors: Chia-Wei Ho, Nantou County (TW); Min-Chia Wang, New Taipei (TW); Hsiu-Ming Yeh, Hsinchu (TW); Chung-Ming Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 54 days.

(21) Appl. No.: 17/568,727

(22) Filed: Jan. 5, 2022

(65) Prior Publication Data
US 2023/0178128 A1    Jun. 8, 2023

(30) Foreign Application Priority Data
Dec. 7, 2021 (TW) .................................. 110145592

(51) Int. Cl.
*G11C 7/00* (2006.01)
*G11C 8/08* (2006.01)

(52) U.S. Cl.
CPC ...................................... *G11C 8/08* (2013.01)

(58) Field of Classification Search
CPC .... G11C 8/08; G11C 7/00; G11C 5/02; G11C 5/06
See application file for complete search history.

(56) References Cited

U.S. PATENT DOCUMENTS

| | | | |
|---|---|---|---|
| 2005/0128858 A1* | 6/2005 | Lee ........................... | G11C 8/08 365/230.06 |
| 2008/0232173 A1* | 9/2008 | Chen ........................ | G11C 8/08 365/185.23 |
| 2011/0242872 A1* | 10/2011 | Hanzawa ................. | G11C 7/18 365/51 |
| 2012/0120751 A1* | 5/2012 | Okahiro .............. | G11C 11/4094 365/207 |
| 2013/0148411 A1* | 6/2013 | Atsumi .................... | G11C 8/08 365/230.06 |
| 2017/0169874 A1 | 6/2017 | Dray | |
| 2017/0358344 A1* | 12/2017 | Ishii ......................... | G11C 7/22 |
| 2020/0098406 A1* | 3/2020 | Lu ....................... | G11C 11/1673 |

* cited by examiner

Primary Examiner — Hien N Nguyen
(74) Attorney, Agent, or Firm — Winston Hsu

(57) ABSTRACT

A word line driving circuit includes a first circuit and a second circuit. The first circuit is configured to provide a first word line driving voltage and a second word line driving voltage based on a first control signal, a second control signal, a first bias voltage, a second bias voltage and a base voltage. The second circuit is configured to provide the first control signal and the second control signal based on a third control signal, a fourth control signal, a word line control signal, a reverse word line control signal, the first bias voltage, the second bias voltage and the base voltage. The first bias voltage and the second bias voltage have different levels during the read mode and the program mode for adaptively adjusting the read voltage and the program voltage, thereby improving the data access time.

10 Claims, 8 Drawing Sheets

US 11,810,643 B2

WORD LINE DRIVING CIRCUIT WITH HIGH ACCESS EFFICIENCY

CROSS REFERENCE TO RELATED APPLICATION

This application claims priority of Taiwan Application No. 110145592 filed on Dec. 7, 2021.

BACKGROUND OF THE INVENTION

1. Field of the Invention

The present invention is related to a word line driving circuit with high access efficiency, and more particularly, to a word line driving circuit with high access efficiency for driving non-volatile memory.

2. Description of the Prior Art

With rapid development in technology and increasing demand in the function of information systems, the speed and accuracy of data access, data transmission, data storage and data display need to be improved. The operation of memory is crucial to the efficiency of information systems.

Modern electronic devices are often required to allow multi-systems to run multiple processes on the data processing system. When receiving multiple access requests associated with different types of data access, a memory access controller needs to arrange the sequence for executing different access requests so that each memory program/read command may be executed accurately without any omission or repetition. Therefore, there is a need for improving the memory efficiency by controlling the data access of the memory.

SUMMARY OF THE INVENTION

The present invention provides a word line driving circuit having a first circuit and a second circuit. The first circuit includes a first to an eighth transistors, and is configured to provide a first word line driving voltage and a second word line driving voltage based on a first control signal, a second control signal, a first bias voltage, a second bias voltage and a base voltage. The second circuit includes a ninth to a sixteenth transistors, and is configured to provide the first control signal and the second control signal based on a word line control signal, a reverse word line control signal, the first bias voltage, the second bias voltage and the base voltage. The first transistor includes a first end coupled to the base voltage, a second end and a control end coupled to a first reverse control signal associated with the first control signal. The second transistor includes a first end coupled to the second end of the first transistor, a second end for outputting the first word line driving voltage and a control end coupled to the first bias voltage. The third transistor includes a first end coupled to the second end of the second transistor, a second end and a control end coupled to the second bias voltage. The fourth transistor includes a first end coupled to the second end of the third transistor, a second end and a control end coupled to a second reverse control signal associated with the second control signal. The fifth transistor includes a first end coupled to the base voltage, a second end and a control end coupled to the control end of the first transistor. The sixth transistor includes a first end coupled to the second end of the fifth transistor, a second end for outputting the second word line driving voltage and a control end coupled to the first bias voltage. The seventh transistor includes a first end coupled to the second end of the sixth transistor, a second end and a control end coupled to the second bias voltage. The eighth transistor includes a first end coupled to the second end of the seventh transistor, a second end coupled to the second end of the fourth transistor and a control end coupled to the control end of the fourth transistor. The ninth transistor includes a first end coupled to the base voltage, a second end and a control end. The tenth transistor includes a first end coupled to the second end of the ninth transistor, a second end and a control end coupled to the first bias voltage. The eleventh transistor includes a first end coupled to the second end of the tenth transistor, a second end and a control end coupled to the second bias voltage. The twelfth transistor includes a first end coupled to the second end of the eleventh transistor, a second end and a control end coupled to the first word line control signal. The thirteenth transistor includes a first end coupled to the base voltage, a second end coupled to the control end of the ninth transistor and a control end coupled to the second end of the ninth transistor. The fourteenth transistor includes a first end coupled to the second end of the thirteenth transistor, a second end and a control end coupled to the first bias voltage. The fifteenth transistor includes a first end coupled to the second end of the fourteenth transistor, a second end and a control end coupled to the second bias voltage. The sixteenth transistor includes a first end coupled to the second end of the fifteenth transistor, a second end coupled to the second end of the twelfth transistor and a control end coupled to the reverse word line control signal, wherein a phase of the word line control signal is opposite to a phase of the reverse word line control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
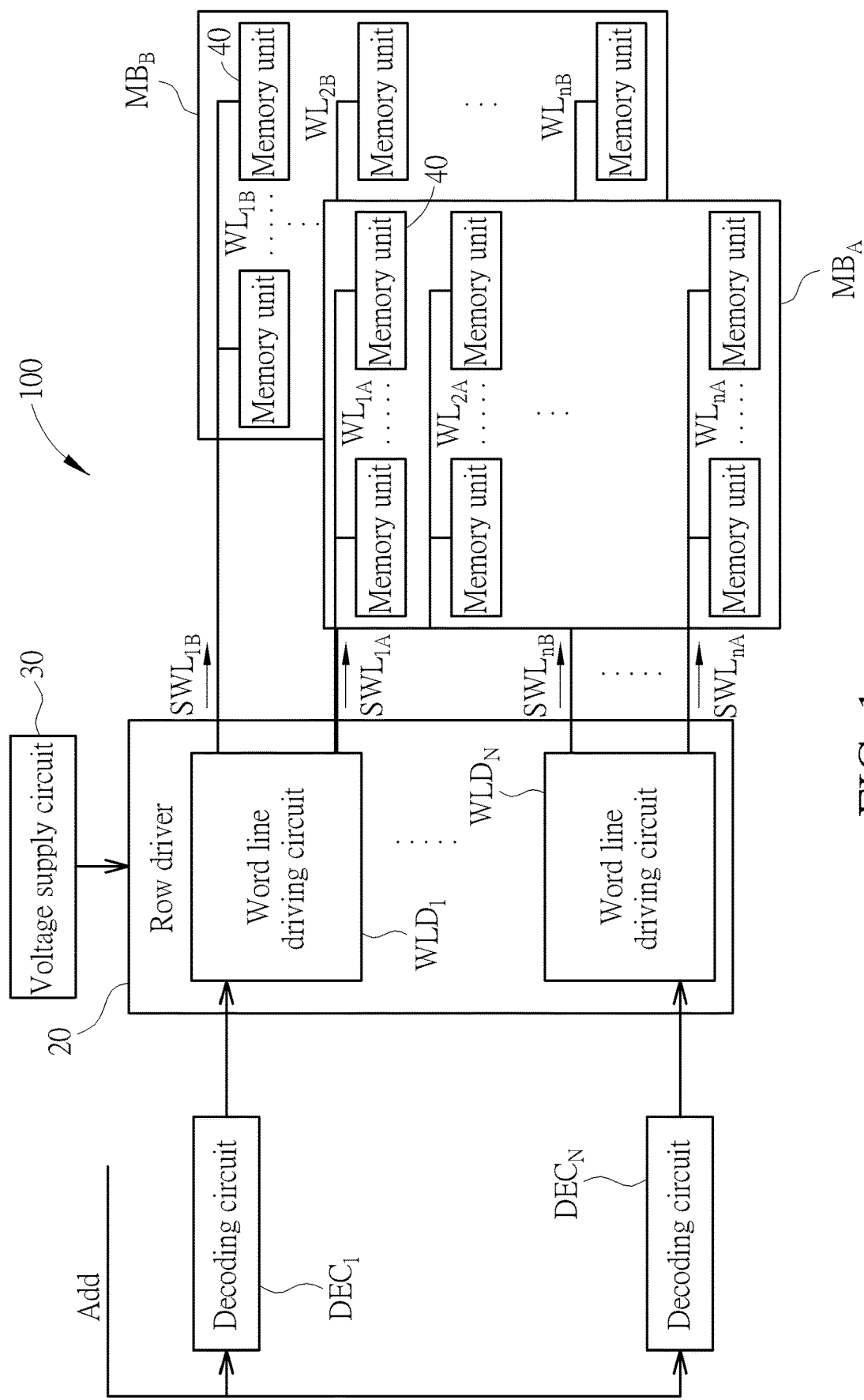
FIG. 1 is a diagram illustrating a memory device according to an embodiment of the present invention.

FIG. 1 is a diagram illustrating a memory device 100 according to an embodiment of the present invention. The memory device includes decoding circuits $DEC_1$-$DEC_N$, a row driver 20, a voltage supply circuit 30, and a plurality of memory blocks, wherein N is a positive integer. For illustrative purpose, FIG. 1 depicts two memory blocks $MB_A$ and $MB_B$ each including a plurality of memory units 40. However, the number of the memory blocks does not limit the scope of the present invention.

The row driver 20 includes N word line driving circuits $WLD_1$-$WLD_N$ configured to drive the memory block $MB_A$ via word lines $WL_{1A}$-$WL_{nA}$ and drive the memory block $MB_B$ via word lines $WL_{1B}$-$WL_{nB}$, wherein each word line is coupled to a plurality of memory units 40 and n is a positive integer. Each word line driving circuit is configured to output two word line driving voltages to the memory blocks $MB_A$ and $MB_B$ for driving the corresponding memory units 40. More specifically, the word line driving circuit $WLD_1$ is configured to output a word line driving voltage $SWL_{1A}$ to the word line $WL_{1A}$ for driving the memory blocks $MB_A$ and output a word line driving voltage $SWL_{1B}$ to the word line $WL_{1B}$ for driving the memory blocks $MB_B$. Similarly, the word line driving circuit $WLD_N$ is configured to output a word line driving voltage $SWL_{nA}$ to the word line $WL_{nA}$ for driving the memory blocks $MB_A$ and output a word line driving voltage $SWL_{nB}$ to the word line $WL_{nB}$ for driving the memory blocks $MB_B$.

The decoding circuits $DEC_1$-$DEC_N$ are configured to decode a memory address Add for generating the decoding signals associated with the word line driving circuits $WLD_1$-$WLD_N$, thereby selecting a corresponding word line driving circuit and a corresponding word line in the row driver 20. For example, when the memory address Add corresponds to the memory units 40 of the memory block $MB_A$ which are coupled to the word line $WL_{1A}$, the memory address Add may indicate that the word line driving circuit $WLD_1$ associated with the memory block $MB_A$ should be used to access the memory block $MB_A$. When the memory address Add corresponds to the first row of memory units 40 in the memory block $MB_A$, the memory address Add may indicate that the memory block $MB_A$ should be accessed via the word line $WL_{1A}$ associated with the first row of memory units 40. The voltage supply circuit 30 is configured to provide the row driver 20 with the operating voltages for performing program, read and erase operations on the memory blocks $MB_A$ and $MB_B$.

Figure 2:
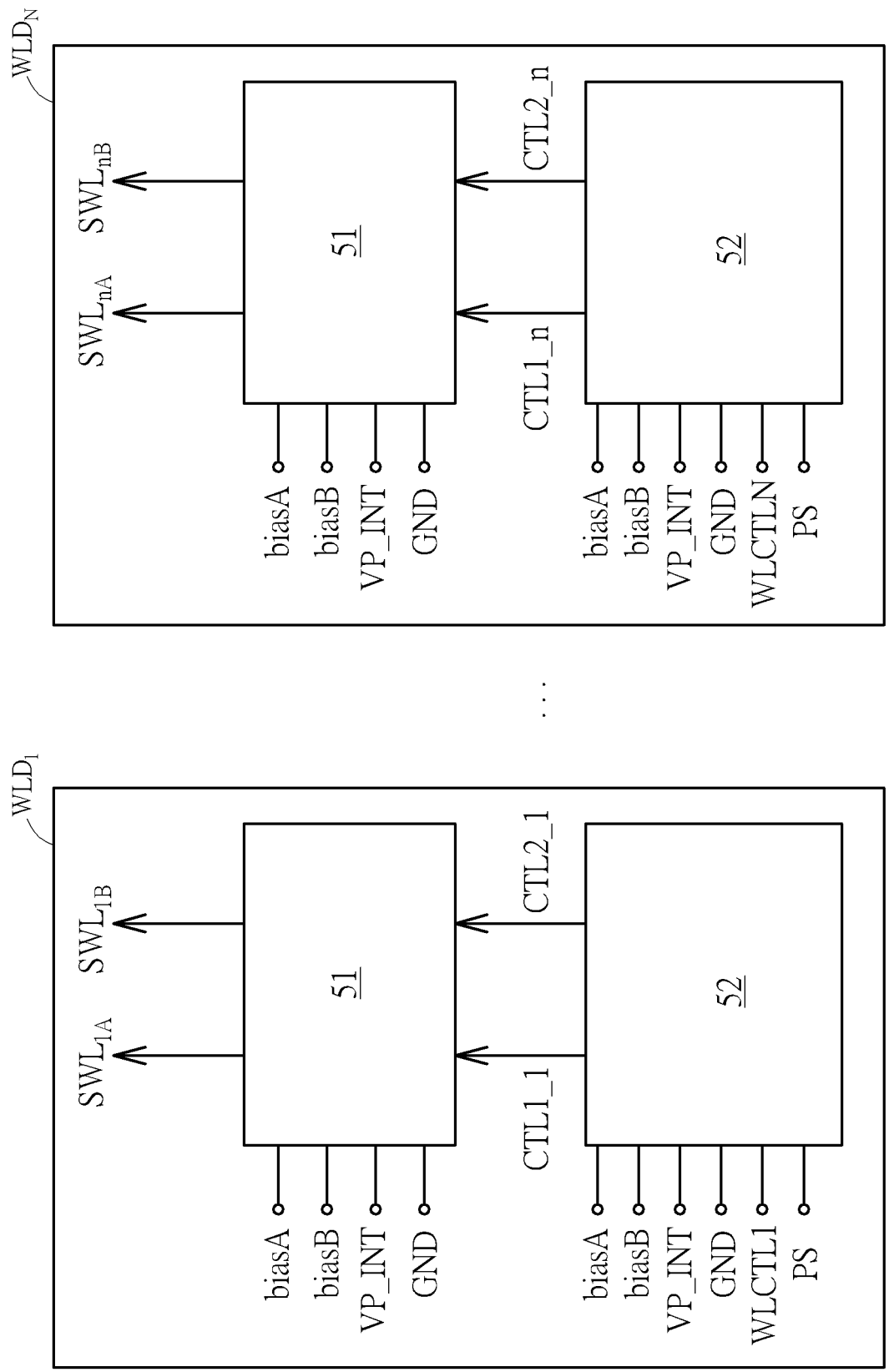
FIG. 2 is a functional diagram illustrating each word line driving circuit in a memory device according to an embodiment of the present invention.

FIG. 2 is a functional diagram illustrating each word line driving circuit in the memory device 100 according to an embodiment of the present invention. Each of the word line driving circuits $WLD_1$-$WLD_N$ includes a first circuit 51 and a second circuit 52. In the word line driving circuit $WLD_1$, the first circuit 51 is configured to provide word line driving voltages $SWL_{1A}$ and $SWL_{1B}$ based on a first control signal CTL1_1, a second control signal CTL2_1, a first bias voltage biasA, a second bias voltage biasB, a base voltage VP_INT, and a ground voltage GND for driving the corresponding word lines $WL_{1A}$ and $WL_{1B}$; the second circuit 52 is configured to provide the first control signal CTL1_1 and the second control signal CTL2_1 to the first circuit 51 based on a word line control signal WLCTL1, the first bias voltage biasA, the second bias voltage biasB, the base voltage VP_INT, the ground voltage GND and a select signal PS.

Similarly, in the word line driving circuit $WLD_N$, the first circuit 51 is configured to provide word line driving voltages $SW_{nA}$ and $SWL_{nB}$ based on a first control signal CTL1_n, a second control signal CTL2_n, the first bias voltage biasA, the second bias voltage biasB, the base voltage VP_INT, and the ground voltage GND for driving the corresponding word lines $WL_{nA}$ and $WL_{nB}$; the second circuit 52 is configured to provide the first control signal CTL1_n and the second control signal CTL2_n to the first circuit 51 based on a word line control signal WLCTLN, the first bias voltage biasA, the second bias voltage biasB, the base voltage VP_INT, the ground voltage GND and the select signal PS.

Figure 3:
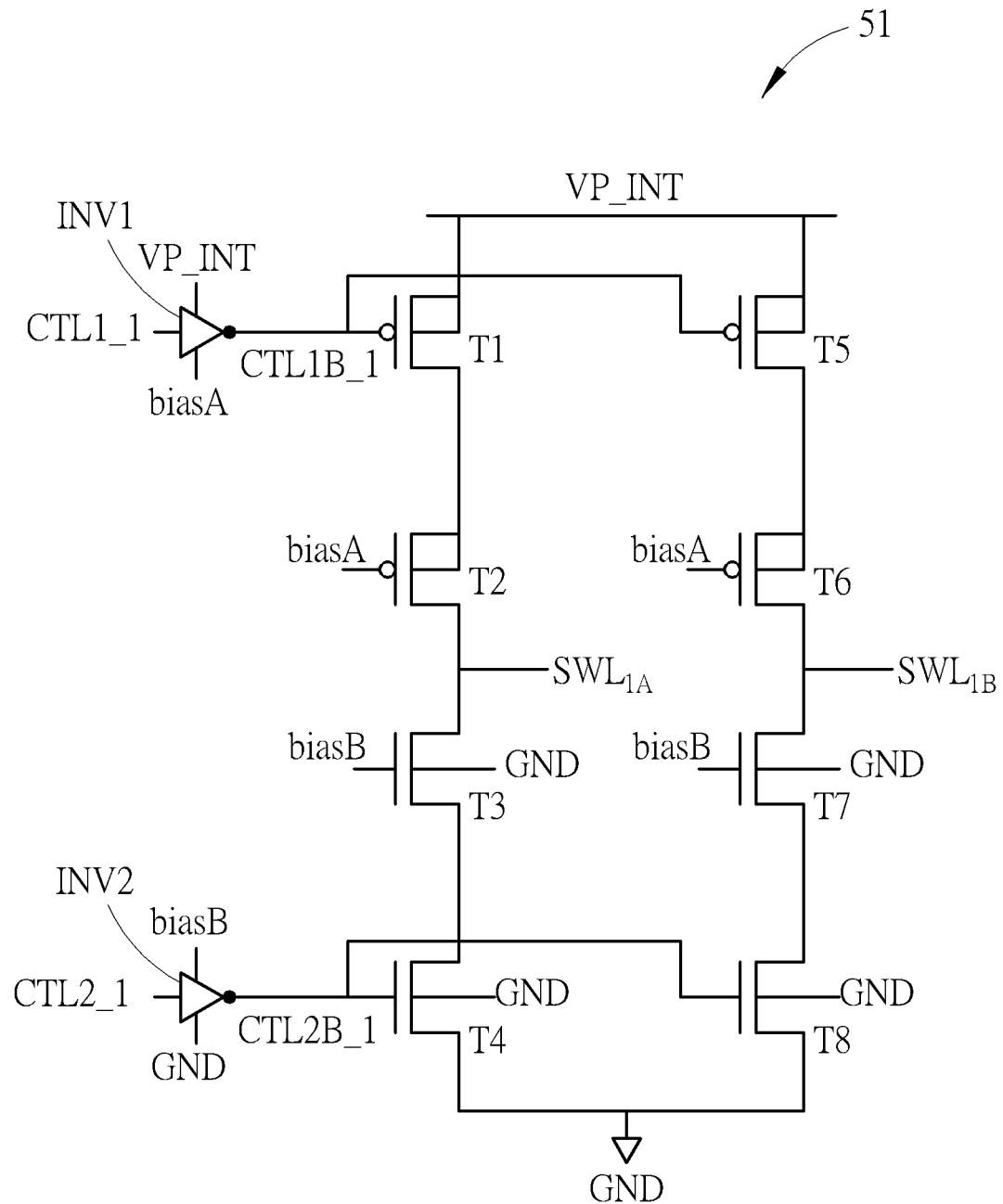
FIG. 3 is a diagram illustrating an implementation of the first circuit of each word line driving circuit in a memory device according to an embodiment of the present invention.

FIG. 3 is a diagram illustrating an implementation of the first circuit 51 of each word line driving circuit in the memory device 100 according to an embodiment of the present invention. For illustrative purpose, FIG. 3 depicts the first circuit 51 of the word line driving circuit $WLD_1$, wherein the first circuit 51 is configured to provide the word line driving voltages $SWL_{1A}$ and $SWL_{1B}$ for driving the word lines $WL_{1A}$ and $WL_{1B}$ in the corresponding memory blocks.

In the embodiment illustrated in FIG. 3, the first circuit 51 includes transistors T1-T8 and invertors INV1-INV2. The invertor INV1 includes an input end for receiving the first control signal CTL1_1 and an output end for providing a first reverse control signal CTL1B_1, wherein the phase of the first control signal CTL1_1 is opposite to the phase of the first reverse control signal CTL1B_1. The invertor INV2 includes an input end for receiving the second control signal CTL2_1 and an output end for providing a second reverse control signal CTL2B_1, wherein the phase of the second control signal CTL2_1 is opposite to the phase of the second reverse control signal CTL2B_1. Meanwhile, the inverter INV1 is further coupled to the first bias voltage biasA and the base voltage VP_INT and the inverter INV2 is further coupled to the second bias voltage biasB and the ground voltage GND for preventing over-stress. The transistor T1 includes a first end coupled to the base voltage VP_INT, a second end, and a control end coupled to the output end of the invertor INV1 for receiving the first reverse control signal CTL1B_1. The transistor T2 includes a first end coupled to the second end of the transistor T1, a second end for outputting the word line driving voltage $SWL_{1A}$, and a control end coupled to the first bias voltage biasA. The transistor T3 includes a first end coupled to the second end of the transistor T2, a second end, and a control end coupled to the second bias voltage biasB. The transistor T4 includes a first end coupled to the second end of the transistor T3, a second end coupled to the ground voltage GND, and a control end coupled to the output end of the inverter INV2 for receiving the second reverse control signal CTL2B_1. The transistor T5 includes a first end coupled to the base voltage VP_INT, a second end, and a control end coupled to the output end of the inverter INV1 for receiving the first reverse control signal CTL1B_1. The transistor T6 includes a first end coupled to the second end of the transistor T5, a second end for outputting the word line driving voltage $SWL_{1B}$, and a control end coupled to the first bias voltage biasA. The transistor T7 includes a first end coupled to the second end of the transistor T6, a second end, and a control end coupled to the second bias voltage biasB. The transistor T8 includes a first end coupled to the second end of the transistor T7, a second end coupled to the ground voltage GND, and a control end coupled to the output end of the inverter INV2 for receiving the second reverse control signal CTL2B_1. Furthermore, the first end and a third end of each of the transistors T1, T2, T5 and T6 are coupled to each other, and the third ends of the transistors T3, T4, T7 and T8 are coupled to the ground voltage GND.

In the present invention, the transistors T1-T8 may be field effect transistors (FETs). In an embodiment, the transistors T1, T2, T5 and T6 may be P-type FETs, wherein the first end is a source terminal, the second end is a drain terminal, the third end is a body terminal, and the control end is a gate terminal; the transistors T3, T4, T7 and T8 may be N-type FETs, wherein the first end is a drain terminal, the second end is a source terminal, the third end is a body terminal, and the control end is a gate terminal. However, the type of the transistors T1-T8 does not limit the scope of the present invention.

Figure 4:
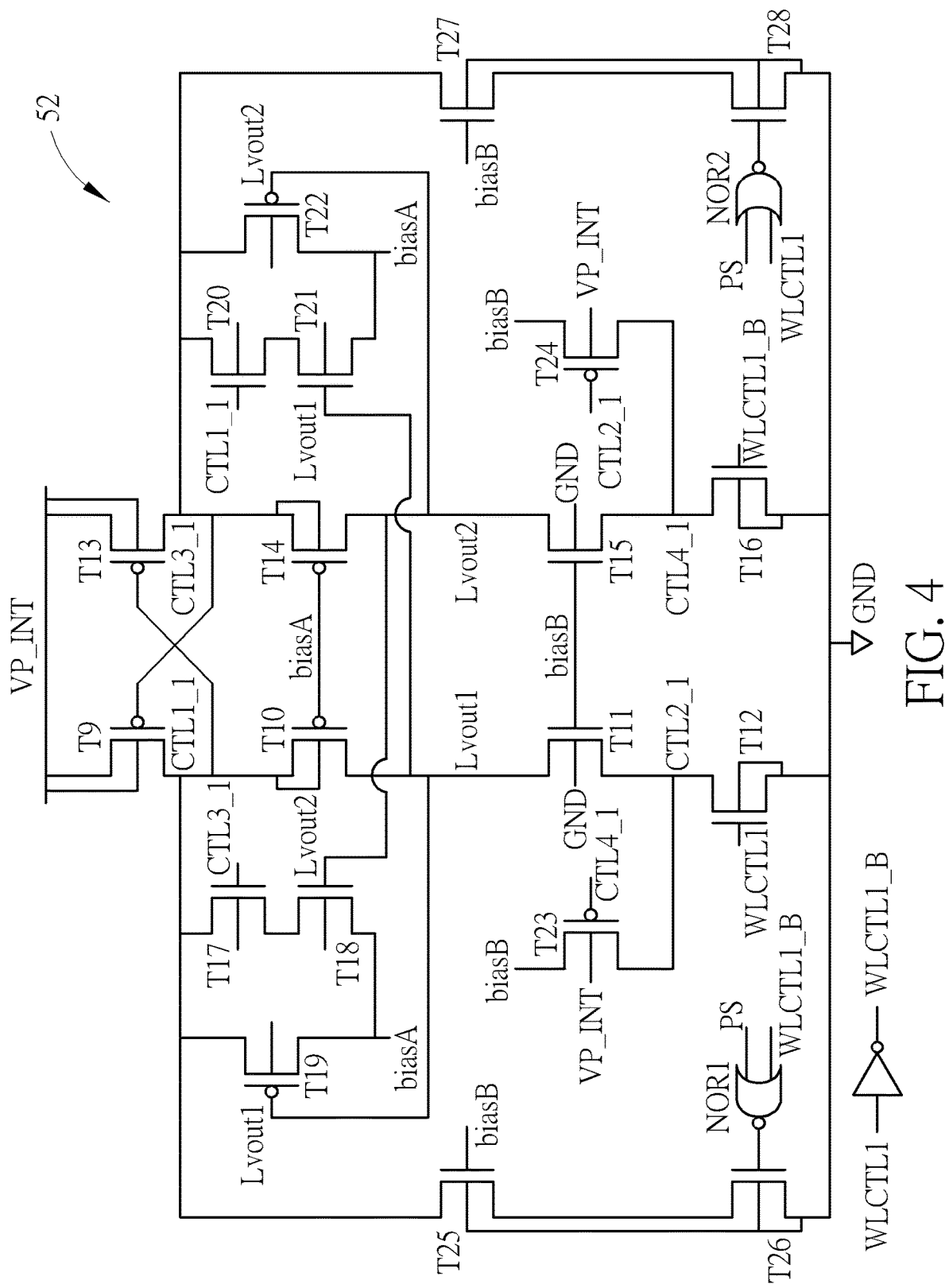
FIG. 4 is a diagram illustrating an implementation of the second circuit of each word line driving circuit in a memory device according to an embodiment of the present invention.

FIG. 4 is a diagram illustrating an implementation of the second circuit 52 of each word line driving circuit in the memory device 100 according to an embodiment of the present invention. For illustrative purpose, FIG. 4 depicts the second circuit 52 of the word line driving circuit $WLD_1$ which includes transistors T9-T28 and logic gates NOR1 and NOR2. The transistor T9 includes a first end coupled to the base voltage VP_INT, a second end for outputting the first control signal CTL1_1, and a control end coupled to the second end of the transistor T13. The transistor T10 includes a first end coupled to the second end of the transistor T9, a second end for outputting the first voltage Lvout1, and a control end coupled to the first bias voltage biasA. The transistor T11 includes a first end coupled to the second end of the transistor T10, a second end for outputting the second control signal CTL2_1, and a control end coupled to the second bias voltage biasB. The transistor T12 includes a first end coupled to the second end of the transistor T11, a second end coupled to the ground voltage GND, and a control end coupled to the word line control signal WLCTL1. The transistor T13 includes a first end coupled to the base voltage VP_INT, a second end for outputting the third control signal CTL3_1, and a control end coupled to the second end of the transistor T9. The transistor T14 includes a first end coupled to the second end of the transistor T13, a second end for outputting the second voltage Lvout2, and a control end coupled to the first bias voltage biasA. The transistor T15 includes a first end coupled to the second end of the transistor T14, a second end for outputting the fourth control signal CTL4_1, and a control end coupled to the second bias voltage biasB. The transistor T16 includes a first end coupled to the second end of the transistor T15, a second end coupled to the ground voltage GND, and a control end coupled to a reverse word line control signal WLCTL1_B, wherein the phase of the reverse word line control signal WLCTL1_B is opposite to the phase of the word line control signal WLCTL1. Furthermore, the first end and a third end of each of the transistors T9, T10, T13 and T14 are coupled to each other, and the second end and the third end of each of the transistors T12 and T16 are coupled to each other.

In the present invention, the transistors T9-T16 may be FETs. In an embodiment, the transistors T9, T10, T13 and T14 may be P-type FETs, wherein the first end is a source terminal, the second end is a drain terminal, the third end is a body terminal, and the control end is a gate terminal; the transistors T11, T12, T15 and T16 may be N-type FETs, wherein the first end is a drain terminal, the second end is a source terminal, the third end is a body terminal, and the control end is a gate terminal. However, the type of the transistors T9-T16 does not limit the scope of the present invention.

In the second circuit 52, the transistors T17-T19 form a first voltage generating circuit which is configured to provide the first control signal CTL1_1 based on the third control signal CTL3_1, the first voltage Lvout1 and the second voltage Lvout2. The transistor T17 includes a first end coupled to the second end of the transistor T9, a second end, and a control end coupled to the third control signal CTL3_1. The transistor T18 includes a first end coupled to the second end of the transistor T17, a second end coupled to the first bias voltage biasA, and a control end coupled between the second end of the transistor T14 and the first end of the transistor T15 for receiving the second voltage Lvout2. The transistor T19 includes a first end coupled to the second end of the transistor T9, a second end coupled to the first bias voltage biasA, and a control end coupled between the second end of the transistor T10 and the first end of the transistor T11 for receiving the first voltage Lvout1.

In the second circuit 52, the transistor T23 forms a second voltage generating circuit which is configured to provide the second control signal CTL2_1 based on the fourth control signal CTL4_1. The transistor T23 includes a first end coupled to the second bias voltage biasB, a second end coupled between the second end of the transistor T11 and the first end of the transistor T11 for providing the second control signal CTL2_1, and a control end coupled to the fourth control signal CTL4_1.

In the second circuit 52, the transistors T20-T22 form a third voltage generating circuit which is configured to provide the third control signal CTL3_1 based on the first control signal CTL1_1, the first voltage Lvout1 and the second voltage Lvout2. The transistor T20 includes a first end coupled to the second end of the transistor T13, a second end, and a control end coupled to the first control signal CTL1_1. The transistor T21 includes a first end coupled to the second end of the transistor T20, a second end coupled to the first bias voltage biasA, and a control end coupled between the second end of the transistor T10 and the first end of the transistor T11 for receiving the first voltage Lvout1. The transistor T22 includes a first end coupled to the second end of the transistor T13, a second end coupled to the first bias voltage biasA, and a control end coupled between the second end of the transistor T14 and the first end of the transistor T15 for receiving the second voltage Lvout2.

In the second circuit 52, the transistor T24 forms a fourth voltage generating circuit which is configured to provide the fourth control signal CTL4_1 based on the second control signal CTL2_1. The transistor T24 includes a first end coupled to the second bias voltage biasB, a second end coupled between the second end of the transistor T15 and the first end of the transistor T16 for providing the fourth control signal CTL4_1, and a control end coupled to the second control signal CTL2_1.

In the present invention, the transistors T17-T24 may be FETs. In an embodiment, the transistors T19, T22, T23 and T24 may be P-type FETs, wherein the first end is a source terminal, the second end is a drain terminal, the third end is a body terminal, and the control end is a gate terminal; the transistors T17, T18, T20 and T21 may be N-type FETs, wherein the first end is a drain terminal, the second end is a source terminal, the third end is a body terminal, and the control end is a gate terminal. However, the type of the transistors T17-T24 does not limit the scope of the present invention.

In the second circuit 52, the transistor T25, the transistor T26 and the logic gate NOR1 form a first logic circuit which is configured to control the operational mode of each word line driving circuit based on the word line control signal WLCTL1_B and the select signal PS. The transistor T25 includes a first end coupled to the second end of the transistor T9, a second end, and a control end coupled to the second bias voltage biasB. The transistor T26 includes a first end coupled to the second end of the transistor T25, a second end coupled to the ground voltage GND, and a control end coupled to the output end of the logic gate NOR1. The first input end of the logic gate NOR1 is coupled to the select signal PS, and the second input end of the logic gate NOR1 is coupled to the word line control signal WLCTL1_B.

In the second circuit 52, the transistor T27, the transistor T28 and the logic gate NOR2 form a second logic circuit which is configured to control the operational mode of each word line driving circuit based on the word line control signal WLCTL1 and the select signal PS. The transistor T27 includes a first end coupled to the second end of the transistor T13, a second end, and a control end coupled to the second bias voltage biasB. The transistor T28 includes a first end coupled to the second end of the transistor T27, a second end coupled to the ground voltage GND, and a control end coupled to the output end of the logic gate NOR2. The first input end of the logic gate NOR2 is coupled to the select signal PS, and the second input end of the logic gate NOR2 is coupled to the word line control signal WLCTL1.

In the present invention, the transistors T25-T28 may be FETs, and the logic gates NOR1 and NOR2 may be NOR gates. In an embodiment, the transistors T25-T28 may be N-type FETs, wherein the first end is a drain terminal, the second end is a source terminal, the third end is a body terminal, and the control end is a gate terminal. However, the types of the transistors T25-T28 and the logic gates NOR1 and NOR2 do not limit the scope of the present invention.

Figure 5:
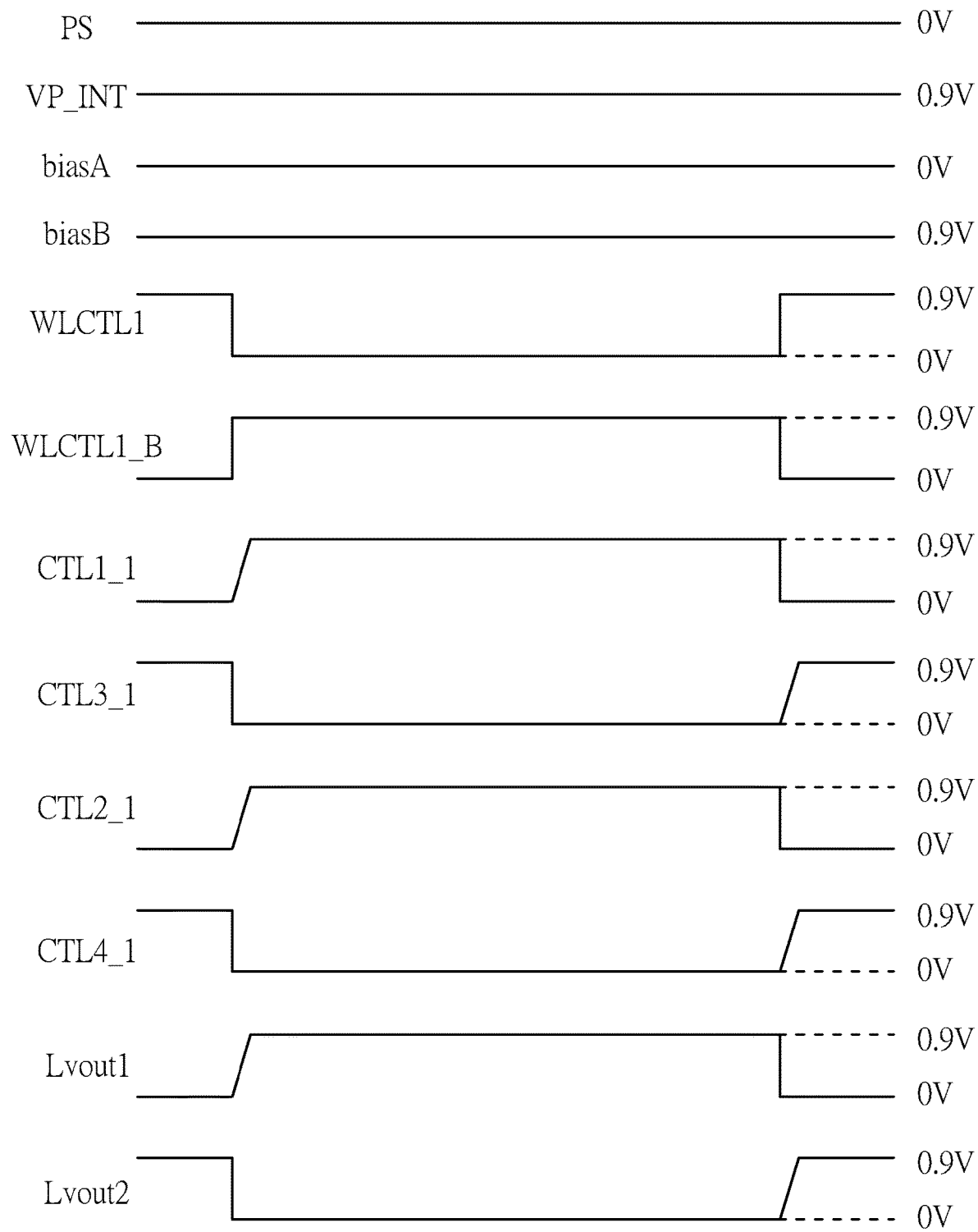
FIG. 5 is a diagram illustrating the waveform of a selected word line when each word line driving circuit in the memory device operates in the read mode according to an embodiment of the present invention.
Figure 6:
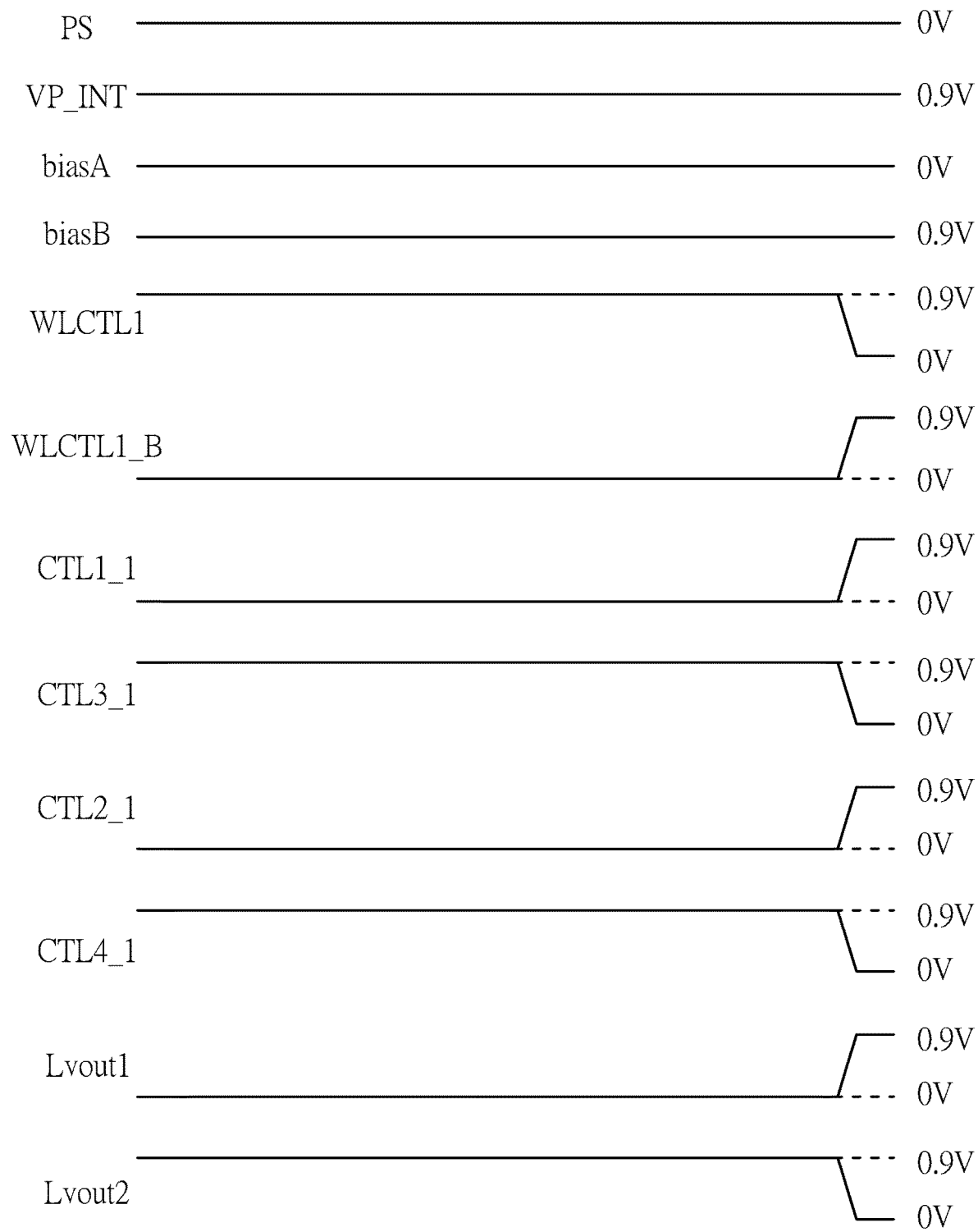
FIG. 6 is a diagram illustrating the waveform of an unselected word line when each word line driving circuit in the memory device operates in the read mode according to an embodiment of the present invention.
Figure 7:
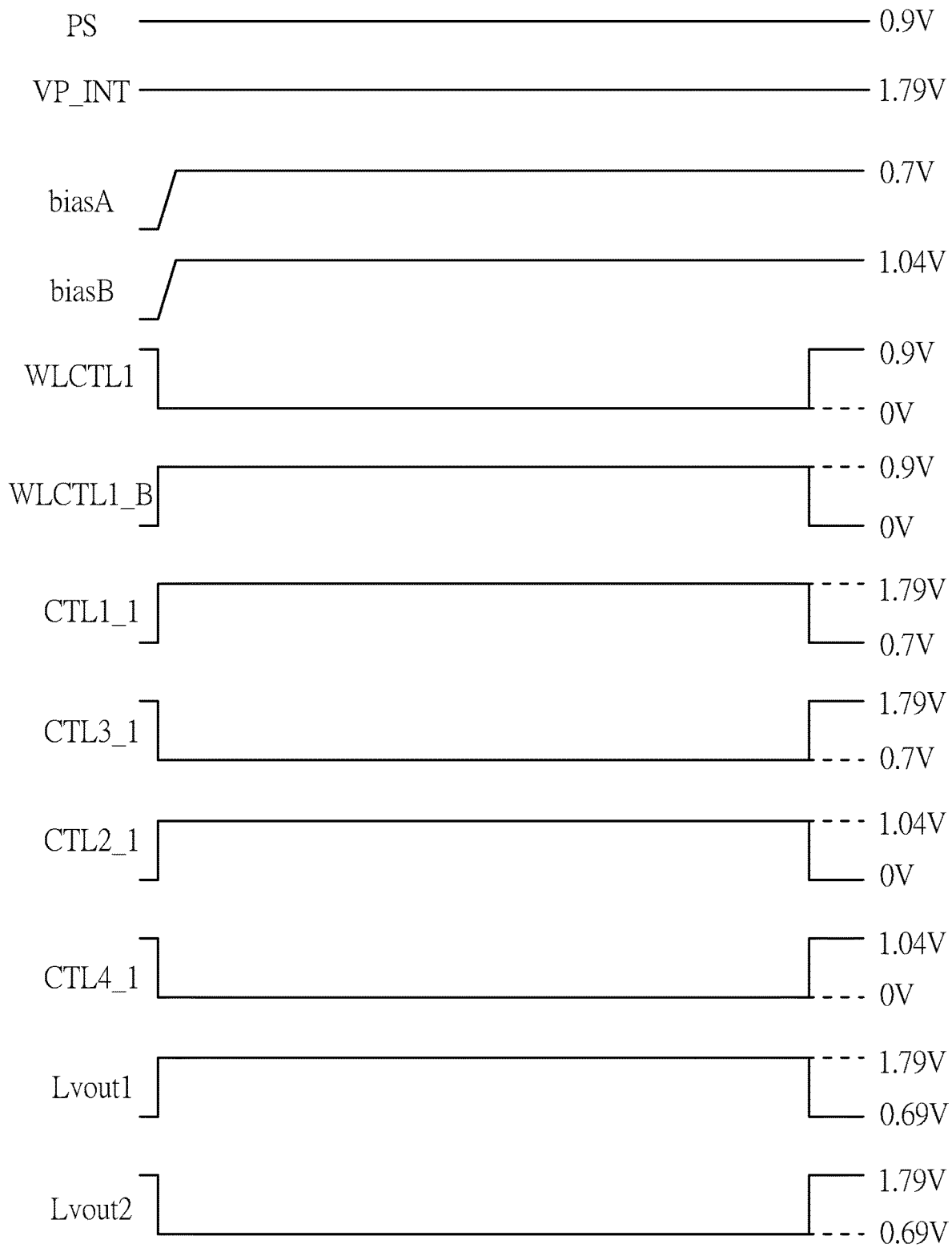
FIG. 7 is a diagram illustrating the waveform of a selected word line when each word line driving circuit in the memory device operates in the program mode according to an embodiment of the present invention.
Figure 8:
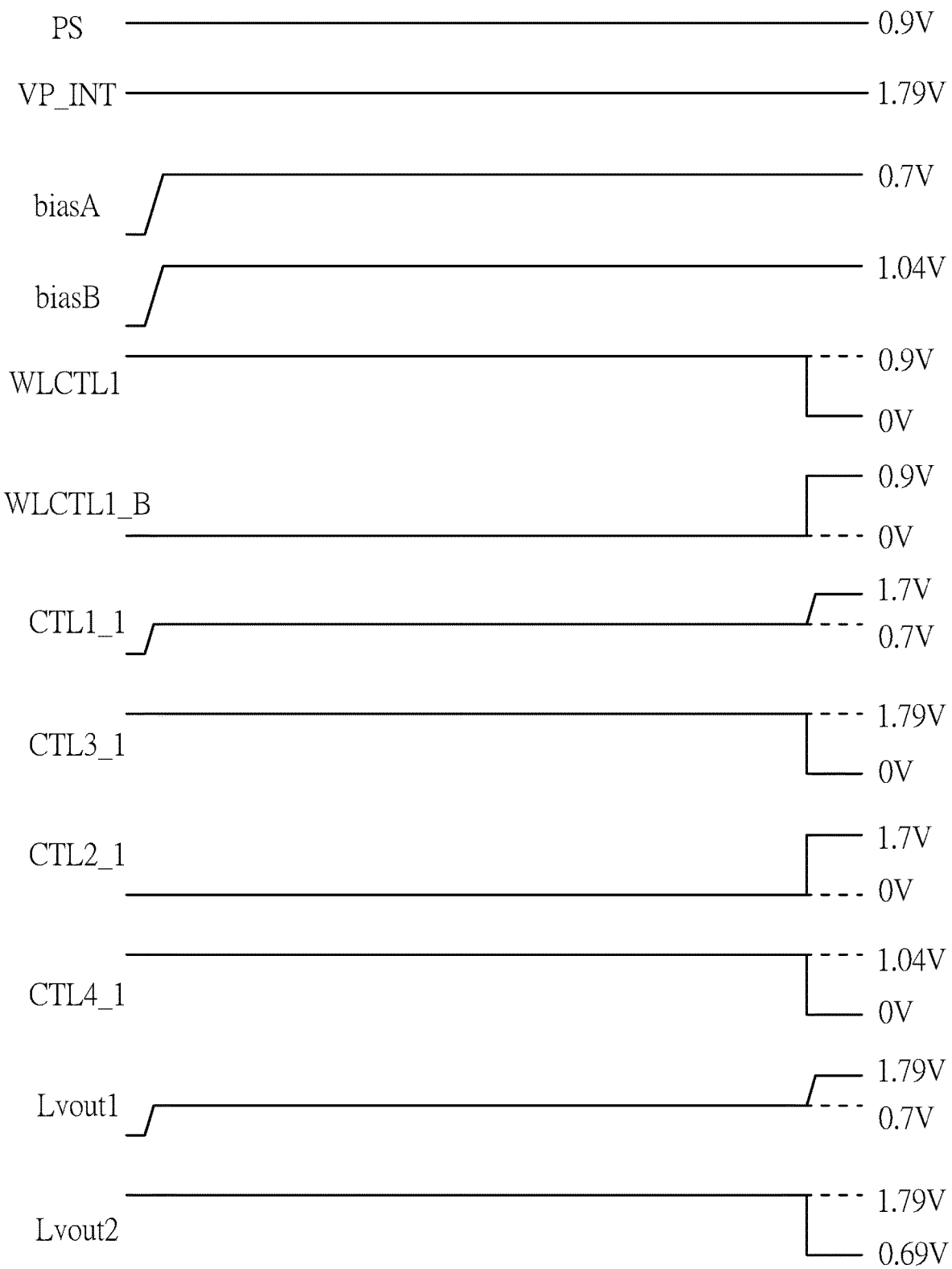
FIG. 8 is a diagram illustrating the waveform of an unselected word line when each word line driving circuit in the memory device operates in the program mode according to an embodiment of the present invention.

FIGS. 5-8 are diagrams illustrating the waveforms of related signals during the operation of each word line driving circuit in the memory device 100 according to an embodiment of the present invention. FIG. 5 is a diagram illustrating the waveform of a selected word line when each word line driving circuit in the memory device 100 operates in the read mode according to an embodiment of the present invention. FIG. 6 is a diagram illustrating the waveform of an unselected word line when each word line driving circuit in the memory device 100 operates in the read mode according to an embodiment of the present invention. FIG. 7 is a diagram illustrating the waveform of a selected word line when each word line driving circuit in the memory device 100 operates in the program mode according to an embodiment of the present invention. FIG. 8 is a diagram illustrating the waveform of an unselected word line when each word line driving circuit in the memory device 100 operates in the program mode according to an embodiment of the present invention.

In the present invention, the transistors T1-T28 are core transistors. Compared to an I/O transistor, a core transistor is characterized in minimized channel length and gate oxide thickness for providing optimized efficiency.

As depicted in FIGS. 5-8, in the read mode, the select signal PS is at a low voltage level (such as 0V), the value of the base voltage VP_INT may be set to the voltage level of core transistor (such as 0.9V), the value of the first bias voltage biasA may be set to a high voltage level (such as 0.9V), and the value of the second bias voltage biasB may be set to the voltage level of core transistor (such as 0.9V). In the program mode, the select signal PS is at a high voltage level (such as 0.9V), the value of the base voltage VP_INT may be set to the voltage level of I/O transistor (such as 1.79V), and the values of the first bias voltage biasA and the second bias voltage biasB may be set to around half the voltage level of core transistor. In an embodiment, the value of the first bias voltage biasA may be set to 0.4*VP_INT (about 0.7V), and the value of the second bias voltage biasB may be set to 0.6*VP_INT (about 1.04V) in the program mode. However, the above-mentioned voltage levels are merely for illustrative purpose and do not limit the scope of the present invention.

In an embodiment, each memory unit 40 in the memory blocks of the memory device 100 may be non-volatile memory (NVM) which includes, but not limited to, read-only memory (ROM), erasable programmable read-only memory (EPROM), electrically-erasable programmable read-only memory (EEPROM), flash EEPROM, non-volatile static random access memory (NVSRAM), ferroelectric random access memory (FeRAM), or eFuse functioning as one-time programmable read-only memory (OTP-ROM). However, the type of the memory device 100 does not limit the scope of the present invention.

In conclusion, the present memory device 100 can provide each word line driving circuit with the first bias voltage biasA and the second bias voltage biasB having different levels during the read mode and the program mode, thereby adaptively adjusting g the read voltage and the program voltage. Therefore, the present invention can protect the memory device from over-drive and improve the data access efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A word line driving circuit, comprising:
  a first circuit configured to provide a first word line driving voltage and a second word line driving voltage based on a first control signal, a second control signal, a first bias voltage, a second bias voltage and a base voltage, and comprising:
    a first transistor, including:
      a first end coupled to the base voltage;
      a second end; and
      a control end coupled to a first reverse control signal associated with the first control signal;
    a second transistor, including:
      a first end coupled to the second end of the first transistor;
      a second end for outputting the first word line driving voltage; and
      a control end coupled to the first bias voltage;
    a third transistor, including:
      a first end coupled to the second end of the second transistor;
      a second end; and
      a control end coupled to the second bias voltage;
    a fourth transistor, including:
      a first end coupled to the second end of the third transistor;
      a second end; and
      a control end coupled to a second reverse control signal associated with the second control signal;
    a fifth transistor, including:
      a first end coupled to the base voltage;
      a second end; and
      a control end coupled to the control end of the first transistor;
    a sixth transistor, including:
      a first end coupled to the second end of the fifth transistor;

a second end for outputting the second word line driving voltage; and
a control end coupled to the first bias voltage;
a seventh transistor, including:
a first end coupled to the second end of the sixth transistor;
a second end; and
a control end coupled to the second bias voltage;
an eighth transistor, including:
a first end coupled to the second end of the seventh transistor;
a second end coupled to the second end of the fourth transistor; and
a control end coupled to the control end of the fourth transistor; and
a second circuit configured to provide the first control signal and the second control signal based on a word line control signal, a reverse word line control signal, the first bias voltage, the second bias voltage and the base voltage, and comprising:
a ninth transistor, including:
a first end coupled to the base voltage;
a second end; and
a control end;
a tenth transistor, including:
a first end coupled to the second end of the ninth transistor;
a second end; and
a control end coupled to the first bias voltage;
an eleventh transistor, including:
a first end coupled to the second end of the tenth transistor;
a second end; and
a control end coupled to the second bias voltage;
a twelfth transistor, including:
a first end coupled to the second end of the eleventh transistor;
a second end; and
a control end coupled to the first word line control signal;
a thirteenth transistor, including:
a first end coupled to the base voltage;
a second end coupled to the control end of the ninth transistor; and
a control end coupled to the second end of the ninth transistor;
a fourteenth transistor, including:
a first end coupled to the second end of the thirteenth transistor;
a second end; and
a control end coupled to the first bias voltage;
a fifteenth transistor, including:
a first end coupled to the second end of the fourteenth transistor;
a second end; and
a control end coupled to the second bias voltage;
a sixteenth transistor, including:
a first end coupled to the second end of the fifteenth transistor;
a second end coupled to the second end of the twelfth transistor; and
a control end coupled to the reverse word line control signal, wherein a phase of the word line control signal is opposite to a phase of the reverse word line control signal.

2. The word line driving circuit of claim 1, wherein:
the first transistor, the second transistor, the fifth transistor, the sixth transistor, the ninth transistor, the tenth transistor, the thirteenth transistor and the fourteenth transistor have a first doping type; and
the third transistor, the fourth transistor, the seventh transistor, the eighth transistor, the eleventh transistor, the twelfth transistor, the fifteenth transistor and the sixteenth transistor have a second doping type which is different from the first doping type.

3. The word line driving circuit of claim 1, wherein the second circuit further comprises:
a first voltage generating circuit configured to provide the first control signal based on a third control signal, a first voltage established on the second end of the tenth transistor and a second voltage established on the second end of the fourteenth transistor, and comprising:
a seventeenth transistor, including:
a first end coupled between the second end of the ninth transistor and the first end of the tenth transistor;
a second end; and
a control end coupled to the third control signal;
an eighteenth transistor, including:
a first end coupled to the second end of the seventeenth transistor;
a second end; and
a control end coupled to the second voltage;
a nineteenth transistor, including:
a first end coupled to the first end of the seventeenth transistor;
a second end coupled to the second end of the eighteenth transistor; and
a control end coupled to the first voltage; and
a second voltage generating circuit configured to provide the third control signal based on the first control signal, the first voltage and the second voltage, and comprising:
a twentieth transistor, including:
a first end coupled between the second end of the thirteenth transistor and the first end of the fourteenth transistor;
a second end; and
a control end coupled to the first control signal;
a twenty-first transistor, including:
a first end coupled to the second end of the twentieth transistor;
a second end; and
a control end coupled to the first voltage;
a twenty-second transistor, including:
a first end coupled to the first end of the twentieth transistor;
a second end coupled to the second end of the twenty-first transistor; and
a control end coupled to the second voltage.

4. The word line driving circuit of claim 3, wherein:
the first transistor, the second transistor, the fifth transistor, the sixth transistor, the ninth transistor, the tenth transistor, the thirteenth transistor, the fourteenth transistor, the nineteenth transistor and the twenty-second transistor have a first doping type; and
the third transistor, the fourth transistor, the seventh transistor, the eighth transistor, the eleventh transistor, the twelfth transistor, the fifteenth transistor, the sixteenth transistor, the eighteenth transistor, the twentieth transistor and the twenty-first transistor have a second doping type which is different from the first doping type.

5. The word line driving circuit of claim 1, wherein the second circuit further comprises:
a twenty-third transistor configured to provide the second control signal based on a fourth control signal, and including:
a first end coupled to the second bias voltage;
a second end coupled between the second end of the eleventh transistor and the first end of the twelfth transistor; and
a control end coupled to the fourth control signal; and
a twenty-fourth transistor configured to provide the fourth control signal based on the second control signal, and including:
a first end coupled to the second bias voltage;
a second end coupled between the second end of the fifteenth transistor and the first end of the sixteenth transistor; and
a control end coupled to the second control signal.

6. The word line driving circuit of claim 5, wherein:
the first transistor, the second transistor, the fifth transistor, the sixth transistor, the ninth transistor, the tenth transistor, the thirteenth transistor, the fourteenth transistor, the twenty-third transistor and the twenty-fourth transistor have a first doping type; and
the third transistor, the fourth transistor, the seventh transistor, the eighth transistor, the eleventh transistor, the twelfth transistor, the fifteenth transistor and the sixteenth transistor have a second doping type which is different from the first doping type.

7. The word line driving circuit of claim 1, wherein the second circuit further comprises:
a first logic circuit configured to control an operational mode of the word line driving circuit based on the reverse word line control signal and a select signal, and comprising:
a twenty-fifth transistor, including:
a first end coupled between the second end of the ninth transistor and the first end of the tenth transistor;
a second end; and
a control end coupled to the second bias voltage;
a twenty-sixth transistor, including:
a first end coupled to the second end of the twenty-fifth transistor;
a second end coupled to the second end of the twelfth transistor; and
a control end; and
a first logic gate, including:
a first input end for receiving the select signal;
a second end for receiving the reverse word line control signal; and
a control end coupled to the control end of the twenty-sixth transistor; and
a second logic circuit configured to control the operational mode of the word line driving circuit based on the word line control signal and the select signal, and comprising:

a twenty-seventh transistor, including:
a first end coupled between the second end of the thirteenth transistor and the first end of the fourteenth transistor;
a second end; and
a control end coupled to the second bias voltage;
a twenty-eighth transistor, including:
a first end coupled to the second end of the twenty-seventh transistor;
a second end coupled to the second end of the sixteenth transistor; and
a control end; and
a second logic gate, including:
a first input end for receiving the select signal;
a second end for receiving the word line control signal; and
a control end coupled to the control end of the twenty-eighth transistor.

8. The word line driving circuit of claim 1, wherein:
the first transistor further includes a third end coupled to the first end of the first transistor;
the second transistor further includes a third end coupled to the first end of the second transistor;
the third transistor further includes a third end coupled to a ground voltage;
the fourth transistor further includes a third end coupled to the ground voltage;
the fifth transistor further includes a third end coupled to the first end of the fifth transistor;
the sixth transistor further includes a third end coupled to the first end of the sixth transistor;
the seventh transistor further includes a third end coupled to the ground voltage; and
the eighth transistor further includes a third end coupled to the ground voltage.

9. The word line driving circuit of claim 1, wherein:
the ninth transistor further includes a third end coupled to the first end of the ninth transistor;
the tenth transistor further includes a third end coupled to the first end of the tenth transistor;
the eleventh transistor further includes a third end coupled to a ground voltage;
the twelfth transistor further includes a third end coupled to the second end of the twelfth transistor;
the thirteenth transistor further includes a third end coupled to the first end of the thirteenth transistor;
the fourteenth transistor further includes a third end coupled to the first end of the fourteenth transistor;
the fifteenth transistor further includes a third end coupled to the ground voltage; and
the sixteenth transistor further includes a third end coupled to the second end of the sixteenth transistor.

10. The word line driving circuit of claim 1, wherein the first circuit further comprises:
a first inverter configured to receive the first control signal and output the first reverse control signal having a phase opposite to a phase of the first control signal; and
a second inverter configured to receive the second control signal and output the second reverse control signal having a phase opposite to a phase of the second control signal.

* * * * *